United States Patent

Donohue et al.

[11] Patent Number: 6,010,636
[45] Date of Patent: Jan. 4, 2000

[54] ELECTRODE WITH DOMES FOR PLASMA FOCUSING

[75] Inventors: John F. Donohue, Scottsdale, Ariz.; Al Sampson, Haverhill, Mass.

[73] Assignee: Lam Research Corporation, Fremont, Calif.

[21] Appl. No.: 08/581,127

[22] Filed: Dec. 29, 1995

[51] Int. Cl.[7] ..................................................... H05H 1/00
[52] U.S. Cl. ........................... 216/71; 438/729; 156/345; 118/723 E
[58] Field of Search ....................... 156/345; 118/723 E; 204/298.33, 298.34, 298.07, 298.08; 216/67, 71; 438/729

[56] References Cited

U.S. PATENT DOCUMENTS

| | | | |
|---|---|---|---|
| 4,230,515 | 10/1980 | Zajac | 156/345 |
| 5,248,371 | 9/1993 | Maher et al. | 156/345 |
| 5,439,524 | 8/1995 | Cain et al. | 118/723 E |

FOREIGN PATENT DOCUMENTS

| | | |
|---|---|---|
| 154733 | 7/1987 | Japan . |
| 341744 | 11/1992 | Japan . |

OTHER PUBLICATIONS

Bogle–Rohwer, Elizabeth et al., "Wall Profile Control in a Triode Etcher", *Solid State Technology*, Apr., 1985, pp. 251–255.

Singh, B. et al., "Hollow Anode Discharge Based High Efficiency RF Triode Reactor", paper presented at the 45th Annual Gaseous Electronics Conference, 27–30 Oct. Boston, Massachusetts.

*Primary Examiner*—Thi Dang
*Attorney, Agent, or Firm*—Cesari and McKenna, LLP

[57] ABSTRACT

An improved anode design, incorporating domes, for plasma reactors enhances plasma density at the anode. The domes give rise to a high-divergence, three-dimensional electric field distribution that accelerates electrons to a focused central region in the dome, thereby increasing ionization and dissociation. The enhanced plasma density increases the reaction rate at a substrate opposite the anode.

48 Claims, 7 Drawing Sheets

FIG. 9

ELECTRODE WITH DOMES FOR PLASMA FOCUSING

FIELD OF THE INVENTION

This invention relates to plasma methods of materials processing. Particularly, this invention relates to methods and apparatus for enhancing reaction rates in etching and deposition processes employing plasma.

BACKGROUND OF THE INVENTION

In one approach to materials processing, deposition of material onto or removal of material from a substrate such as a semiconductor wafer is effected by subjecting the substrate to a processing medium, for example, a plasma, which is generated in situ from gaseous species and serves as the source of the reactive species required by the process. Typically, the reactors for such plasma-driven processes comprise opposing electrodes in a diode or triode configuration, energized so as to create the plasma in a controlled manner in an active region located between an electrode pair. The substrate to be treated is located in the active region near one of the electrodes.

This approach finds wide application, for example, in fabricating VLSI structures for integrated circuits. The desired dimensions of VLSI structures has continued to grow finer and finer. The shrinking scale of these structures has required that the gaseous species forming the plasma be present at lower and lower pressures. This demand for lower processing pressures is problematic for plasma-driven processes because of the critical role the pressure plays in determining the rate of deposition or removal of material. As the pressure is decreased to sufficiently low levels to satisfy the structure's dimensional requirements, the overall efficiency of the deposition or removal process becomes too low to fabricate devices quickly enough to be practical. The lower bound on pressure imposed by reaction-rate requirements has limited the use of plasma-driven processes to fabricating larger, coarser structures than would be otherwise desirable. In order to circumvent this limitation, techniques for improving the plasma density have been applied, so that a reasonable concentration of the desired ionic and neutral reactive species can be maintained at low pressures.

For example, plasma-phase reagent densities have been increased by providing external electrical or magnetic power to the reactor, additional to the usually applied rf bias power. This type of solution increases both the operating cost and complexity of the system. Another type of solution modifies the chamber design, specifically the electrode geometry, to allow an enhanced output without changing power requirements.

Such an electrode-geometry design is the hollow-anode glow discharge apparatus, described in U.S. Pat. No. 5,248,371, the entire disclosure of which is herein incorporated by reference. This patent describes the use of a grounded planar anode, opposing a parallel rf-powered electrode across the active region, perforated with holes to enhance the volume concentration of ions and other reactive species near the substrate. The electric field in the active region moves electrons away from the negatively-biased electrode toward the grounded anode. According to the '371 specification, some electrons enter holes in the anode; these may strike the walls of the holes and thereby cause the emission of secondary electrons, which in turn oscillate between the walls of the holes and collide with the walls or with species in the hole, creating cations and additional secondary electrons, respectively. The generation of cations and secondary electrons avalanches, thereby producing a "hollow-anode glow discharge" in each of the holes. This discharge affects the volume concentration of reactive species near the substrate and thereby enhances the reaction rate. The spatial extent of the hollow-anode glow discharge is by the annular plasma sheath around the periphery of the hole. Since the thickness of the sheath is inversely proportional to the system pressure, by increasing the hole size, a hollow-anode glow discharge can be maintained at lower pressures without changing the rf characteristics.

However, there appear to be limitations to this approach. For example, the hole size cannot be increased indefinitely without degrading the plasma density of the discharge. Likewise, the density can be enhanced by increasing the thickness of the anode over only a limited range, after which a thicker anode shows eroded density and even thicker anodes eventually extinguish the anode discharge. The inherent two-dimensionality of the perforated anode imposes a limit on the reaction rates it can contribute to the substrate.

DESCRIPTION OF THE INVENTION

OBJECTS OF THE INVENTION

It is, accordingly, an object of the present invention to provide a method and apparatus for enhancing etch rates in plasma-driven reactors.

It is another object of the invention to provide an apparatus that minimizes the escape of reactive species to the upper region of the triode reactor.

It is yet another object of the invention to provide such a method and apparatus that can be inexpensively integrated into existing plasma-driven reactors.

BRIEF SUMMARY OF THE INVENTION

The present invention enhances plasma density by incorporating an improved design for the grounded electrode. The electrode of the invention incorporates at least one dome, a hollowstructure of conductive material protruding from the flat portion of the electrode, away from the active region, andstructure forming a cavity open toward the substrate to be treated. In operation, the interior surface of the dome supports, in addition to the rf field usually present, a three-dimensional DC electric field pattern having a substantial field component perpendicular to the major surface of the electrode. The three-dimensional field pattern constitutes a region of high field divergence which is associated with a central region of highly concentrated positive charge.

The cavity contains a central zone holding concentrated plasma surrounded by an ion-depleted plasma sheath lining the interior surface of the dome. The electric field lines radiate outwardly from the positively-charged central zone, cross the sheath, and terminate on the electrode surface. The field distribution accelerates electrons from the region near the dome surface radially inward to converge in the central zone. This phenomenon is referred to herein as "geometrical focusing." Geometrical focusing brings the electrons into collision with ions and neutral species present in the central zone and thus enhances ionization and/or dissociation in the central volume. The enhanced volume concentration of reactive species—ions or high-energy radicals—extends beyond the central zone and out of the cavity, losing intensity and spreading laterally as it spreads toward the substrates located near the opposing electrode. The augmented reactant supply causes an increased rate of material deposit or removal.

Although the term dome has been adopted to describe these protrusionstructures, they need not have a rounded surface. Neither need the surface be continuous, but may be perforated opposite the opening onto the active region to allow gas to enter the cavity from the backside of the electrode. The dome should have adequate diameter parallel to the plane of the electrode to allow adequate room for the central zone within the confines of the plasma sheath. The dimension of the dome perpendicular to the plane of the electrode should be comparable to its radius in the plane of the electrode to provide a significant perpendicular electric field component and an ample central zone volume. In general these dome dimensions and the arrangement of domes on the electrode are chosen in conjunction with processing conditions to give the most uniformly distributed etching or deposition activity and thus the most uniform profile on the substrate. However, the invention may also be used to impose a pattern of varying thickness on the substrate. In this case, the electrode may be designed to emphasize the local rate enhancement contributed by individual domes or groupings of domes.

The present invention is inexpensive to implement compared to power-oriented means of enhancing plasma density and can be easily incorporated into existing systems. A domed electrode may be employed for additional density enhancement in systems that already include power-oriented enhancing means. By virtue of its surface orientation and area, a dome provides greater plasma enhancement than a grid hole of comparable diameter in that it creates a larger central zone, introduces a higher integrated field intensity focused on the central zone, and prevents loss of reactive species to the region above the grid electrode.

BRIEF DESCRIPTION OF THE DRAWINGS

The foregoing discussion will be understood more readily from the following detailed description of the invention, when taken in conjunction with the accompanying drawings, in which like reference numerals indicate identical or functionally similar elements.

It will be appreciated that, for purposes of illustration, these figures are not necessarily drawn to scale.

DETAILED DESCRIPTION OF THE INVENTION

Figure 1:
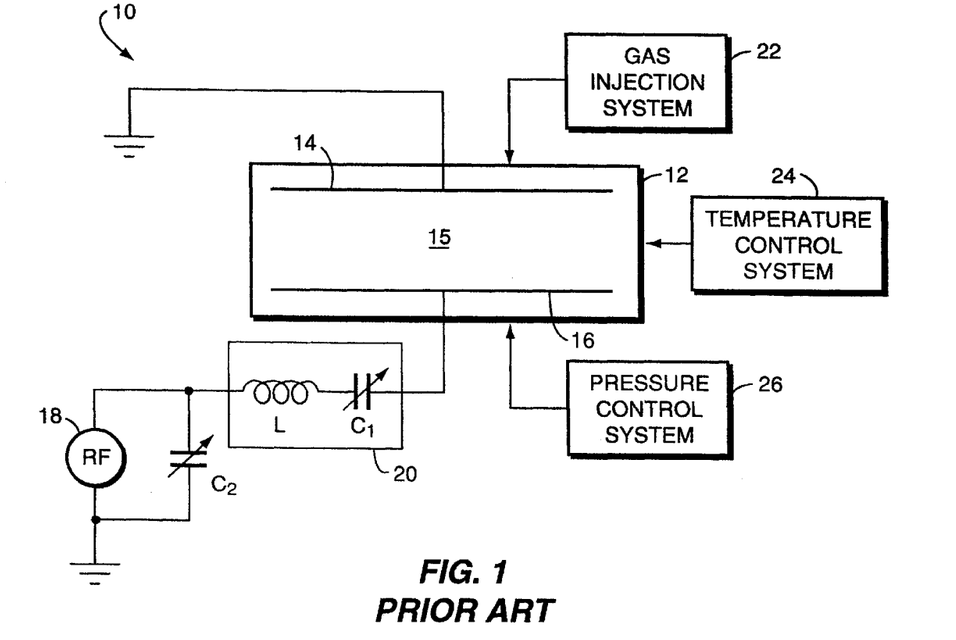
FIG. 1 schematically illustrates a typical prior-art diode reactor.

With reference first to FIG. 1, a typical diode reactor, generally designated at 10, of the prior art includes a reactor compartment 12 with an upper electrode 14 and a lower electrode 16 in opposition across an active region 15. The upper electrode 14 is grounded. The lower electrode 16 is coupled to an rf electrical energy source 18 via a matching network 20 including a first variable capacitor, indicated by $C_1$, and an inductor, indicated by L, in series with the electrode 16 and with the parallel combination of the source 18 and second a variable capacitor, indicated by $C_2$. A gas injection system 22 is coupled to the reaction compartment 12 so as to allow the introduction of gaseous species into the compartment 12. A temperature control system 24 is coupled to the compartment 12 so as to control the temperature of the compartment 12 and of the electrodes 14 and 16. A pressure control system 26 is coupled to the compartment 12 so as to control the pressure therewithin. In operation, the application of rf power from the source 18 to the electrodes 14 and 16 controllably produces a reactive ion etch plasma ("RIE") therebetween in the well-known manner. Typically, the lower electrode 16 receives a negative bias and functions therefore as the cathode, with the upper electrode 14 playing the role of anode.

Figure 2:
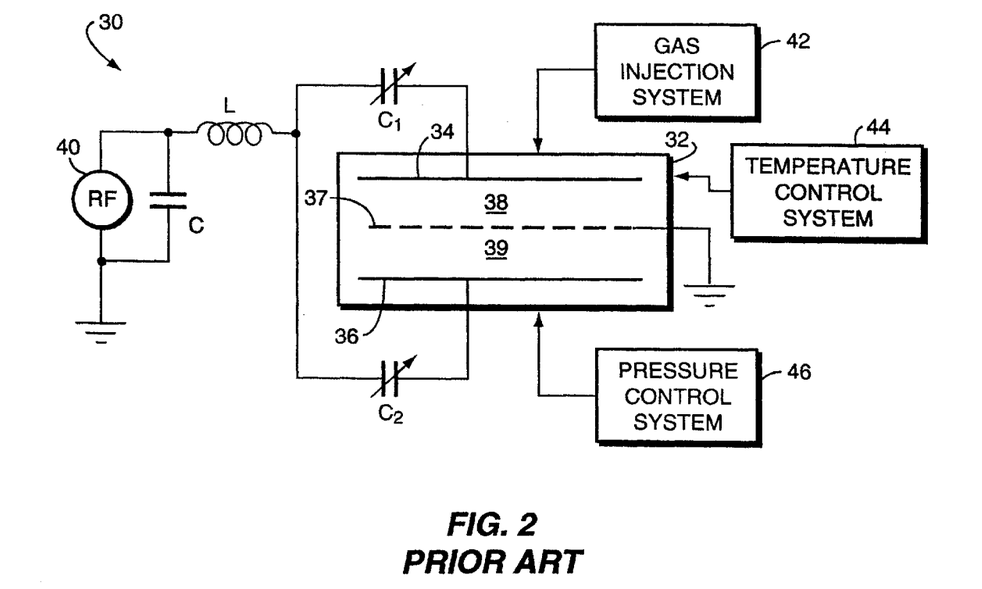
FIG. 2 schematically illustrates a typical prior-art triode reactor.

With reference to FIG. 2, a typical triode reactor, generally designated by 30, of the prior art includes, similarly to reactor 10, a reaction compartment 32 enclosing an upper electrode 34 opposing a lower electrode 36 to define an interelectrode region. The reactor 30 additionally features an intermediately placed grounded grid 37 that divides the interelectrode region into an upper active region 38 and a lower active region 39. The upper electrode 34 and the lower electrode 36 are capacitively coupled to an electrical energy source 40 by means of first and second variable capacitors, indicated by $C_1$ and $C_2$, respectively, which are also joined to an inductor, indicated by L, in series with the parallel combination of the source 40 and a capacitor, indicated by C. A gas injection system 42, a temperature control system 44, and a pressure control system 46 serve the same functions as those ascribed to the analogous systems shown in the diode reactor 10.

In a preferred embodiment, the gas injection system 42 includes a gas diffuser, not shown, positioned between the upper electrode 34 and the grid 37, and the upper electrode 34 is provided with a plurality of apertures, not shown, through which the injected gas flows into the reaction compartment 32.

The temperature control system 44 of the preferred embodiment may include several features that aid in temperature regulation of the compartment 32 and of the electrodes. For example, passageways, not shown, may allow the circulation of a heat transfer medium, such as water, within the upper electrode 34. Bores, not shown, may be provided through the compartment 32 to receive resistive heating elements. The lower electrode 36 may be apertured for the circulation therethrough of a heat transport medium, such as helium and/or water.

The pressure control system 46 of the preferred embodiment includes a pressure controller, not shown, that preferably receives feedback from a pressure manometer, not shown, positioned inside the reaction compartment 32 and controllably throttles an orifice valve in order to establish and maintain the pressure inside the compartment 32 in accordance with a preselected setpoint value. Typically, the setpoint is chosen from a pressure range bounded by twenty-five (25) mTorr and three-thousand (3000) mTorr, although pressures outside this range may be preferred for some applications.

The variable capacitors $C_1$ and $C_2$ may be adjusted in order to selectively provide power to one or both of the electrodes 34 and 36. Both electrodes 34 and 36 may be powered to simultaneously maintain plasmas on either side of the grid 37, that is, in both of the regions 38 and 39. Or, if all of the power from source 40 is supplied to the upper electrode 34 at the expense of the lower electrode 36, a plasma will form only in the upper active region 38. If only the lower electrode 36 is powered, the reactor 30 will operate similarly to the reactor 10. This arrangement, which will form a plasma only in the lower active area 39, is called RIE mode. For some size distributions of the holes through the grid 37, functioning as anode, a hollow-anode glow discharge in the holes can dominate the behavior of the RIE plasma in the lower active region 39, as described in the '371 patent.

Figure 3:
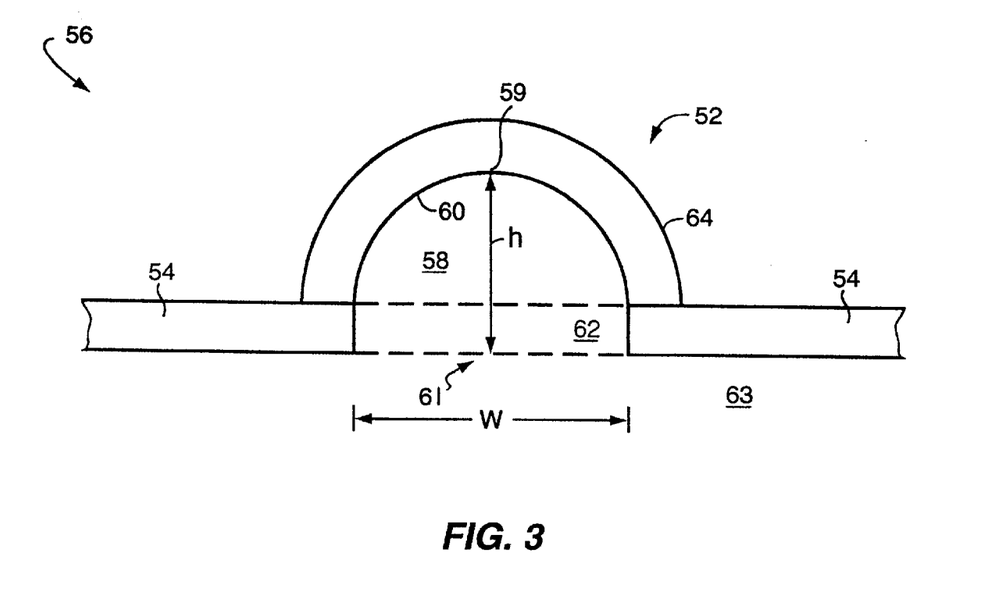
FIG. 3 is a section, perpendicular to the electrode surface, showing a portion of an anode of the invention comprising one dome.
Figure 4:
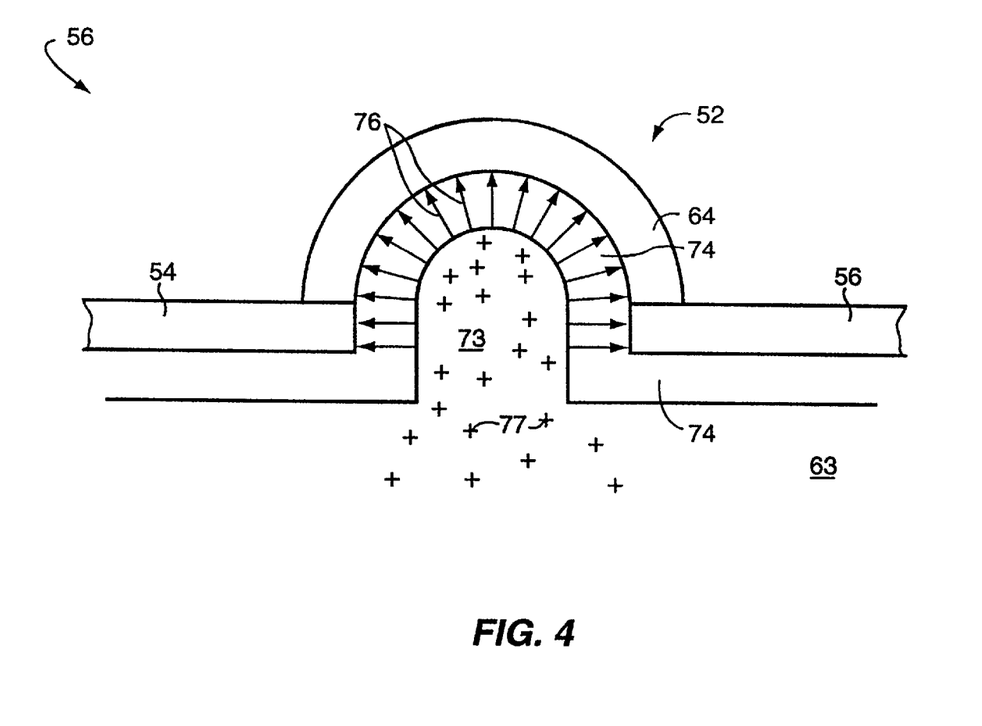
FIG. 4 is a section, perpendicular to the electrode surface, showing a dome of the present invention during operation.

The present invention differs from the configurations described above primarily in the geometry of the anode grid, indicated in FIG. 2 by reference numeral 37. The anode of the invention incorporates one or several domes that provide local enhancement of the plasma density by geometrical focusing. As FIG. 3 shows, a dome 52 protrudes above the flat portion 54 of the anode 56 to form a cavity 58 with interior surface 60. An opening 61 opposite the dome's apex 59 allows the cavity 58 to communicate with the lower active region 63 below the anode 56. The dome 52 is formed from a cylindrical hole 62 in the flat portion 54 of the anode 56 covered by a hemispherical cap 64. With reference to FIG. 4, for some combinations of operating conditions and electrode feature dimensions, a central zone 73 containing plasma exists in the cavity 58, within the plasma sheath 74 lining the interior surface 60 of the dome 52. Electric field lines 76 radiate from positive charges 77 in the central zone 73 and terminate on and perpendicularly to the interior surface 60. Electrons accelerate along the field lines 76 and collide with ions and neutrals in the central zone 73 and thereby increase the volume concentration of reactive neutrals and ions in that zone. Also, the increased charge density due to the three-dimensional geometric focusing supports a stronger field intensity within the cylindrical volume of the hole 62 than would be present in the absence of the cap 64. An augmented density of reactive species is maintained in the active region 63 between the anode and the substrate, outside of the dome. The concentrated region becomes more diffuse, assuming a lower density and wider extent than in the dome 52, as the substrate is approached.

Figure 5A:
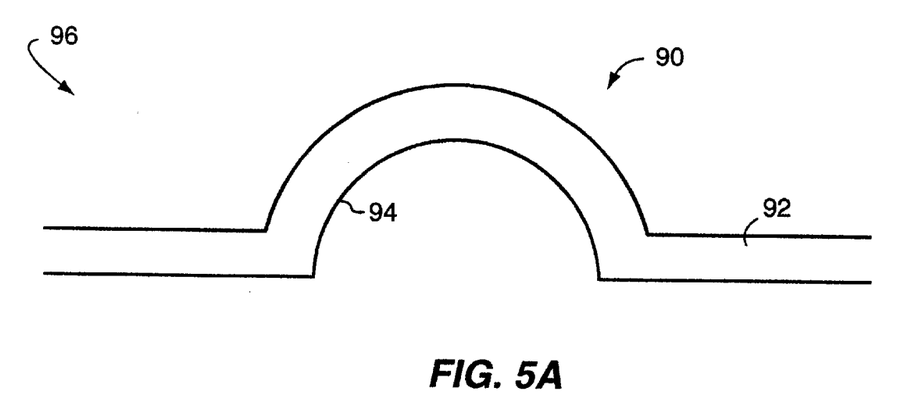
FIGS. 5A–C are sections, taken perpendicular to the electrode surface, showing various permissible forms of the dome of the invention.
Figure 5B:
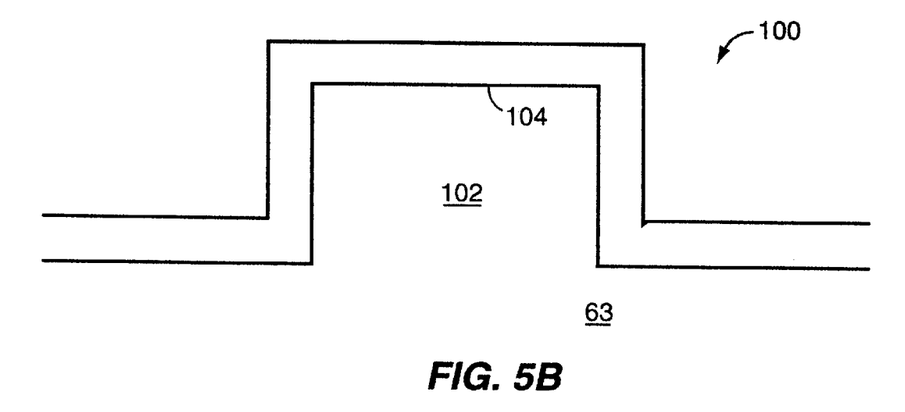
Figure 5C:
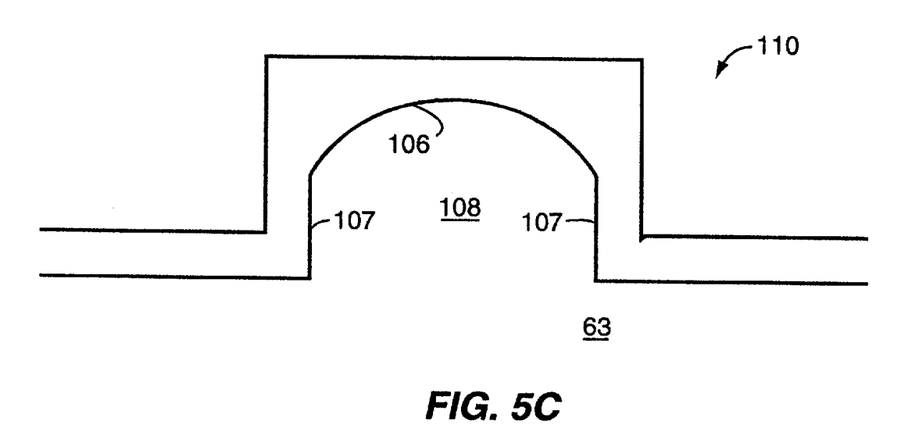

A variety of dome geometries are consistent with the present invention. FIG. 5A illustrates a dome 90 formed in the flat portion 92 of the anode 96 so that its entire interior surface 94 is a portion of a sphere. Domes incorporating spherical surfaces provide the tightest focus because of the radial orientation of the electric field lines. However, entirely cylindrical forms are also proper. A dome 100 with a cylindrical cavity 102 may be topped with a flat surface 104, as FIG. 5B shows. Alternatively, a curved surface, such as an ellipsoidal surface 106, illustrated in FIG. 5C, could top the cylindrical side 107 of a cavity 108 of dome 110.

In order to maintain the plasma in the central zone, the interior of the dome should be more than large enough to accommodate the sheath required by the operating pressure. For greatest plasma density enhancement, the aspect ratio of the dome's interior height h, measured from its opening 61 to its apex 59, to the width of the opening 61 should not be too high or too low. As a rule of thumb, this ratio should fall between about 0.4 and 2.0. In other words, the cavity 58 should be fairly "blocky" in form. Also, the interior surface 60 should focus the electric field lines close enough to the opening so that reactive species are not lost to recombinative collisions before they exit the cavity into the lower active region. Moreover, although a continuous dome cap 64 minimizes the escape of reactive species into the upper region above the anode 54, domes 52 may be perforated to allow them to function as gas injectors into the dome cavities 58 and into the lower active region 63.

Typically, the anode of the invention incorporates an array with several domes, which need not all have identical dimensions. In one embodiment, the electrode may be constructed to provide independent adjustment of the dimensions of individual domes; such construction facilitates fine tuning of reactor performance, so as to accommodate non-uniformities in the reaction chamber, for example. One such adjustable dome comprises a cylindrical aperture closed by a plug forming the upper spherical, flat, or ellipsoidal surface such as the upper surfaces shown in FIGS. 3, 5A, and 5B. The dome's interior height h is altered by moving the plug within the cylindrical aperture, along the axis of the cylinder, and securing the plug at the desired distance from the lower active region 63.

In addition to the domes, the electrode may include holes therethrough, such as the circular holes described in the '371 patent. The ratio of domes to holes, dome and hole size distributions, and the pattern of domes and holes over the electrode are chosen to impart the desired pattern to the wafer surface for a set of reactor operating conditions.

Use of a domed anode of the invention to effect greater plasma etch rates has been demonstrated by the processes described in the following examples. These exemplary process runs employed a triode reactor similar to the one depicted in FIG. 2. The distance between the anode and the lower electrode was 15 mm. The anode was an aluminum circular plate ⅛" thick and 21 cm in diameter. Eighty-four features—holes or domes—were located at feature sites that covered the anode surface in a hexagonal arrangement about a center feature site. Each feature had a circular cross section of 15 mm diameter at the midplane of the plate. The center-to-center spacing of nearest-neighbor features was about 19 mm.

The lower electrode was powered to 1200 watts at 13.56 Mhz, with no power provided to the upper electrode. The anode was grounded. A mixture of trifluoromethane and hexafluoroethane, at respective flow rates of 96 sccm and 24 sccm were directed into the upper region of the reaction compartment, and the total pressure in the compartment maintained at 40 mTorr. The temperature of the upper electrode was maintained at 20° C. The temperature of the lower electrode was maintained at 12° C. As described below, the distribution of holes and domes across the feature sites was different for each of the three runs described.

EXAMPLE 1

Figure 6:
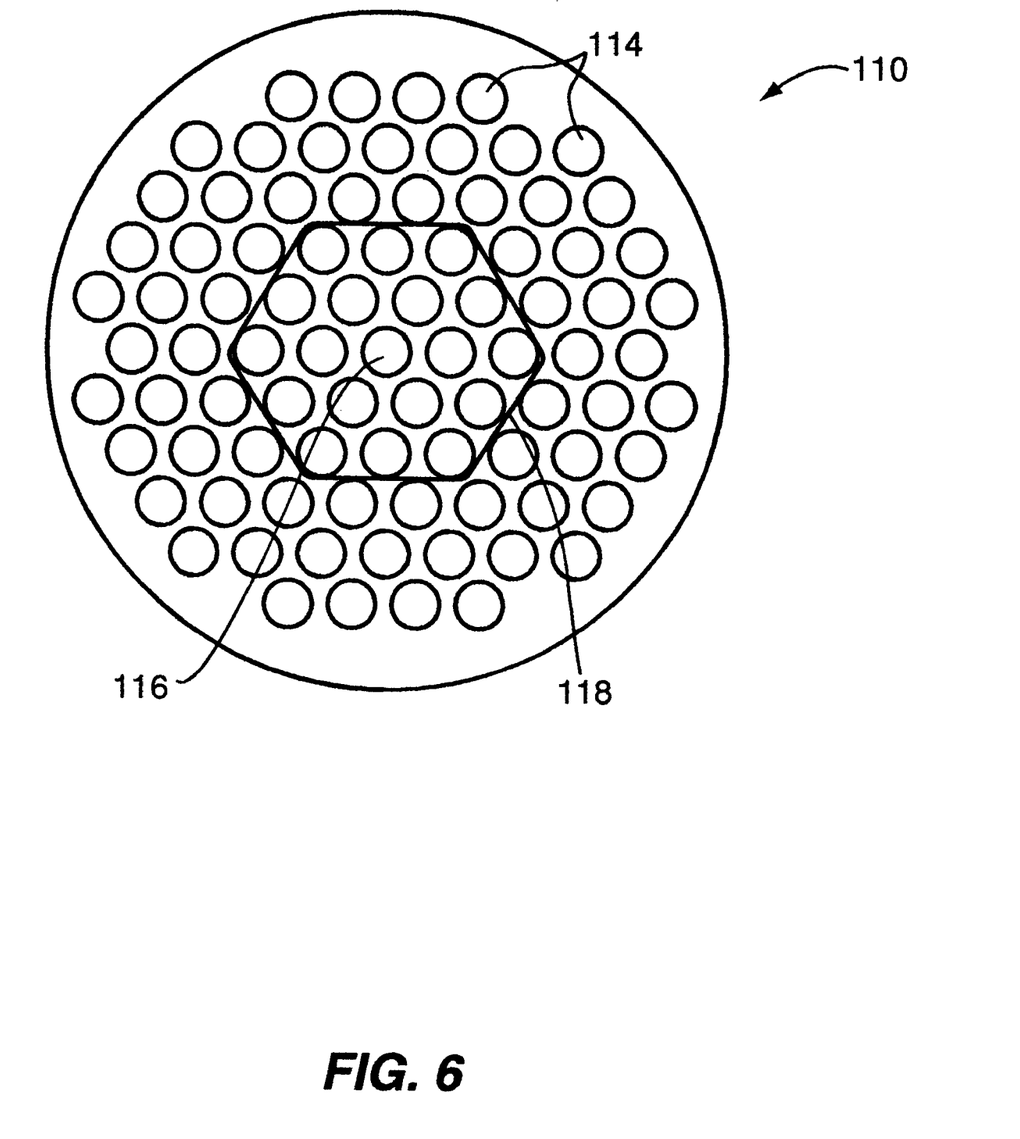
FIG. 6 is a top plan view of a grid electrode of the prior art.

A 200-mm-diameter silicon wafer covered by a 1.8 μm blanket of oxide grown by chemical vapor deposition ("CVD-grown oxide") was mounted at the lower electrode. The anode was a grounded grid electrode 110 of the prior art, as shown in FIG. 6, with open cylindrical holes 114 at all feature sites. The wafer was subjected to a two-minute etch under the process conditions indicated above. After the etch sequence, the thickness of the remaining oxide was measured using a profilometer over a 88-mm-diameter central region centered on the part of the wafer located directly under the central hole 116 and including the wafer surface located under 19 total features, those shown bounded by the curve 118 in the FIG. 6. The global average etch rate, calculated from data over the entire measured area, is 5828 Å/min.

EXAMPLE 2

Figure 7:
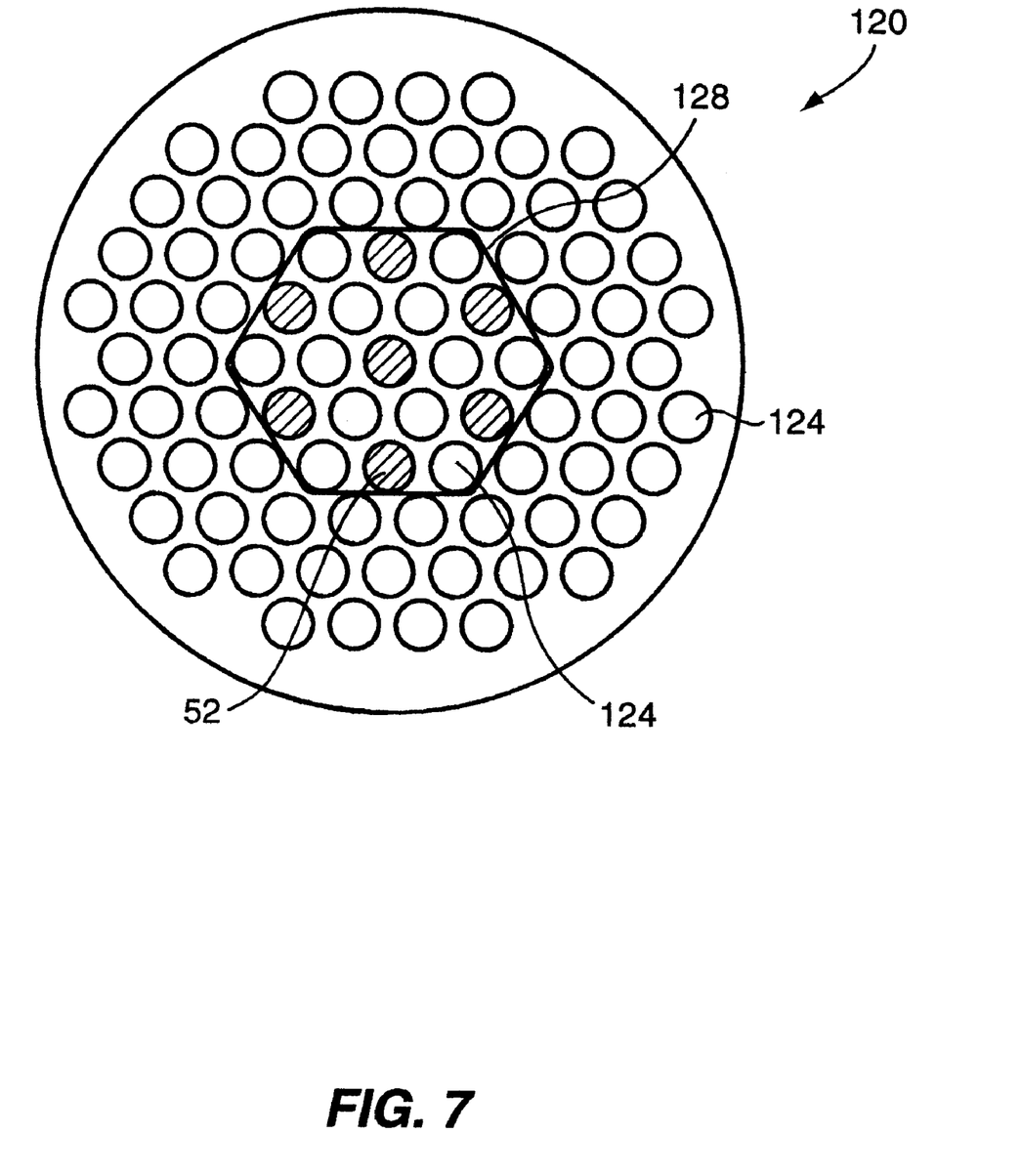
FIG. 7 is a top plan view of an anode of the present invention.
Figure 8:
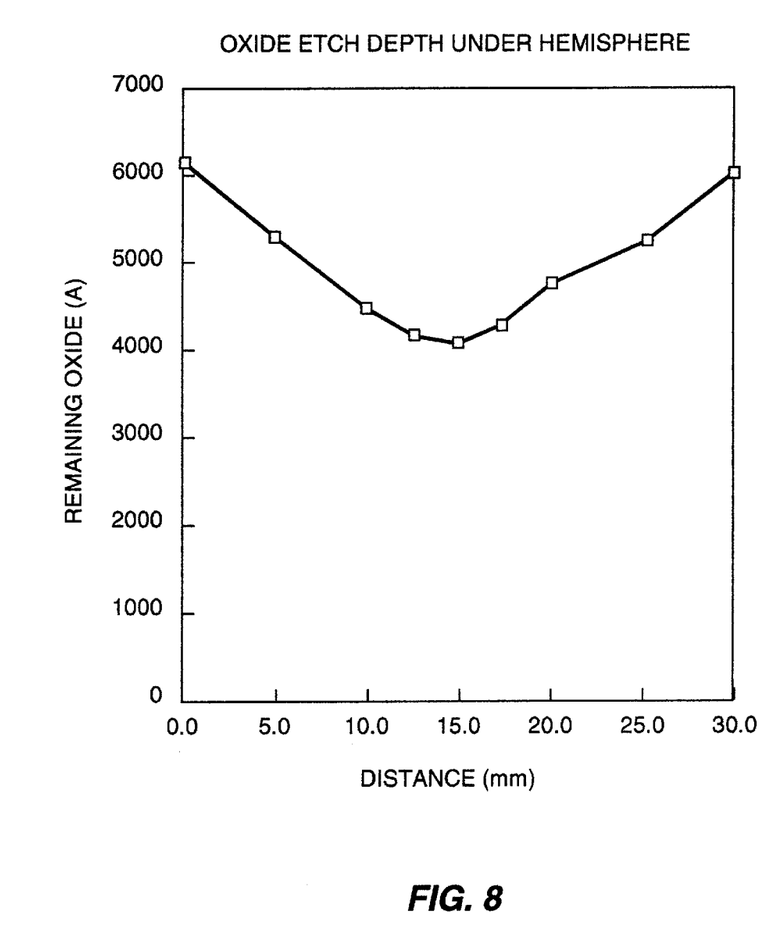
FIG. 8 graphically depicts a crater profile on a wafer etched using an anode of the present invention.

A 200-mm-diameter silicon wafer covered by a 1.8 μm blanket of CVD-grown oxide, similar to that used in the run described for Example 1, was mounted at the lower electrode. The anode 120 featured seven domes 52 placed among cylindrical holes 124 in the arrangement illustrated in FIG. 7. Thus, about 37% of the featured area within curve 128 was covered by domes 52 and the remainder covered by cylindrical holes 124. The domes were each formed from a 15 mm cylindrical hole covered with a 7.5 mm radius aluminum hemisphere as depicted in FIG. 3. The wafer was subjected to a two-minute etch under the process conditions indicated above. After the etch sequence, the thickness of the remaining oxide was measured using a profilometer over a 88-mm-diameter central region centered on the part of the wafer located directly under the center feature 130. The surface profile revealed "craters", indicating local enhancement of the etch rate, in a spatial arrangement corresponding to the arrangement of the overlying domes 52. This pattern indicates that the regions of the wafer located under the domes 52 experienced greater etch rates than did the regions under the holes 124 or under flat portions of the anode 120. The crater profile shown in FIG. 8 indicates that some etch rate enhancement was experienced over regions on the wafer surface having a diameter of about 30 mm, which is about twice the diameter of the opening 71 of the overlying dome 52 itself. The global average etch rate, calculated from data over the entire measured area, was 6197 Å/min. The greatest local etch rate, observed at the centers of the craters, was about 6972 Å/min. The local average etch rate, calculated only from data taken from the craters is 6539 Å/min. This 12% enhancement over that obtained using the hole-featured anode 110 is probably more indicative of the etch rate obtainable by increasing the dome coverage of the anode 120 of the invention.

EXAMPLE 3

Figure 9:
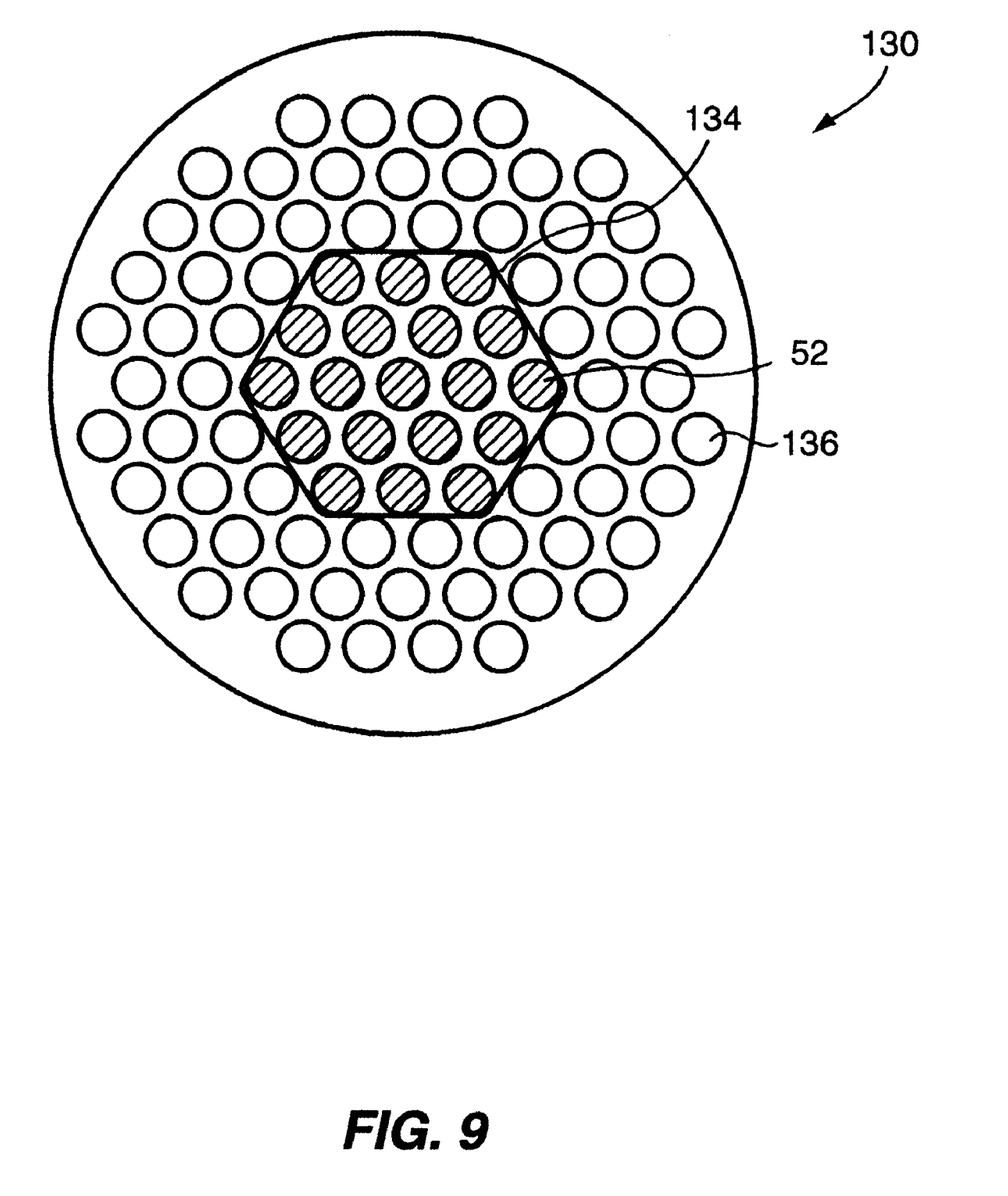
FIG. 9 is a top plan view of an anode of the present invention.

A 200-mm-diameter silicon wafer covered by a 1.8 μm blanket of CVD-grown oxide, in turn covered by a 1-μm layer of resist, was mounted at the lower electrode. Defined in the resist layer was a distribution of 0.35 μm-wide and 0.50 μm-wide contact openings. The anode 130 featured nineteen domes 52 placed at adjacent feature sites in the arrangement illustrated in FIG. 9, so that all 19 features bounded by the curve 134 were domes 52. All of the other features were cylindrical holes 136. No special care was taken to position the contact openings under domes. The wafer was subjected to a three-minute etch according to the processing conditions indicated above. After the etch sequence, the contact openings were examined and the etch rates calculated from the depth of the contact holes under the openings. The average of etch rates at contact openings outside the central region of the wafer under the portion of the anode within curve 134 was about 5000 Å/min. The average of etch rates at contact openings inside the central region was about 6300 Å/min, or 26% higher than those not underlying the domed portion of the electrode.

Several variations of the foregoing system are consistent with the scope of the present invention. For example, the domes may be incorporated into the walls of the reaction compartment. Or, the dome interiors could be coated to further enhance the density or some other characteristic of the plasma. In another variation, the entire cavity of the dome may be accommodated by a planar anode structure, rather than requiring protrusions on the anode surface as shown herein. Although the invention has been described in terms of substantially planar anodes, the domes may be incorporated into an anode having macroscopic curvature. The anode could function as any of the electrodes in any multi-electrode reactor, not just as the anode in the structures discussed herein, without departing from the inventive concept. To enhance ionization, the anode may also be powered electrically or magnetically instead of grounded. The domed anode of the invention could also be used in combination with known high density sources, such as, for example, a electron cyclotron resonance source or a helical resonator.

It will therefore be seen that the foregoing represents a highly advantageous approach to anode grid design, especially for enhancing reaction rates in plasma reactors. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An apparatus for materials processing, the apparatus comprising:
   a. a reaction compartment;
   b. first and second electrodes, opposing one another across an active region within the reaction compartment, the first electrode having a plurality of domes therein, each dome having an interior surface and forming a cavity having an opening toward the active region;
   c. means for conveying gaseous species into the active region; and
   d. a source of electrical excitation, coupled to one of the first and second electrodes, for generating a materials-processing medium in the active region.

2. The apparatus of claim 1 wherein at least some of the domes each support an electric field distribution in its cavity, the electric field distribution having comparable components in three dimensions.

3. The apparatus of claim 1 wherein at least part of the interior surface of at least some of the domes is spherical.

4. The apparatus of claim 1 wherein at least part of the interior surface of at least some of the domes is cylindrical.

5. The apparatus of claim 1 wherein at least part of the interior surface of at least some of the domes is ellipsoidal.

6. The apparatus of claim 1 wherein the opening has a diameter and the cavity has a height, the ratio of the height to the diameter for at least some of the domes being between 0.5 and 2.0, inclusive.

7. The apparatus of claim 1 wherein at least some of the domes each comprise a cylindrical hole in the first electrode and a hemispherical cap topping the hole.

8. The apparatus of claim 1 wherein at least some of the domes each comprise at least one aperture through the interior surface.

9. The apparatus of claim 1 wherein the first electrode is grounded.

10. The apparatus of claim 1 wherein the first electrode is macroscopically planar.

11. The apparatus of claim 1 wherein the materials-processing medium is a plasma.

12. The apparatus of claim 7 wherein the hemispherical cap of at least some of the domes having a cap comprises a hole therethrough.

13. The apparatus of claim 1 wherein the first electrode comprises a plurality of holes therethrough.

14. An electrode for use in a reactor for forming a materials processing medium in an active region between the electrode and an opposite member under the influence of a source of electrical excitation, the electrode comprising a plurality of domes therein, each dome having an interior surface and forming a cavity having an opening toward the active region.

15. The electrode of claim 14 wherein at least some of the domes each support an electric field distribution in its cavity, the electric field distribution having comparable components in three dimensions.

16. The electrode of claim 14 wherein at least part of the interior surface of at least some of the domes is spherical.

17. The electrode of claim 14 wherein at least part of the interior surface of at least some of the domes is cylindrical.

18. The electrode of claim 14 wherein the opening has a diameter and the cavity has a height, the ratio of the height to the diameter for at least some of the domes being between 0.5 and 2.0, inclusive.

19. The electrode of claim 14 wherein at least some of the domes each comprise a cylindrical hole in the electrode and a hemispherical cap topping the hole.

20. The electrode of claim 14 wherein at least some of the domes each comprise at least one aperture through the interior surface.

21. The electrode of claim 14 wherein the electrode is macroscopically planar.

22. The electrode of claim 14 wherein the electrode is capable of generating, in conjunction with the opposite member, a plasma to serve as the materials processing medium.

23. The electrode of claim 19 wherein the hemispherical cap of at least some of the domes having a cap comprises a hole therethrough.

24. The electrode of claim 14 wherein the electrode comprises a plurality of holes therethrough.

25. A method of processing a substrate, the method comprising the steps of:
   a. placing the substrate in an active region of a reaction compartment, the active region being formed between a first electrode and a second electrode in opposition, near the second electrode, the first electrode having a plurality of domes therein, each dome having an interior surface and forming a cavity having an opening toward the active region;
   b. providing gaseous reactants to the active region; and
   c. providing electrical excitation to at least one of the first and second electrodes so as to generate a substrate-processing medium in the active region.

26. The method of claim 25 wherein at least some of the domes each support an electric field distribution in its cavity, the electric field distribution having comparable components in three dimensions.

27. The method of claim 25 wherein at least part of the interior surface of at least some of the domes is spherical.

28. The method of claim 25 wherein at least part of the interior surface of at least some of the domes is cylindrical.

29. The method of claim 25 wherein the opening has a diameter and the cavity has a height, the ratio of the height to the diameter for at least some of the domes being between 0.5 and 2.0, inclusive.

30. The method of claim 25 wherein at least some of the domes each comprise a cylindrical hole in the first electrode and a hemispherical cap topping the hole.

31. The method of claim 25 wherein at least some of the domes each comprise at least one aperture through the interior surface.

32. The method of claim 26 wherein the first electrode is grounded.

33. The method of claim 26 wherein the first electrode is macroscopically planar.

34. The method of claim 26 wherein the substrate-processing medium is a plasma.

35. The method of claim 25 wherein the hemispherical cap of at least some of the domes having a cap comprises a hole therethrough.

36. The method of claim 26 wherein the first electrode comprises a plurality of holes therethrough.

37. The method of claim 25 wherein a plasma of enhanced density forms in the cavity of at least some of the domes.

38. The method of claim 1 wherein a plasma of enhanced density forms in at least some of the domes.

39. The method of claim 25 wherein the presence of the domes causes an enhanced reaction rate at the substrate.

40. The method of claim 26 wherein material is removed from the substrate.

41. The method of claim 26 wherein material is deposited onto the substrate.

42. The method of claim 26 wherein a pattern of surface relief is imparted to the substrate.

43. The method of claim 26 wherein the gaseous species are present at a pressure less 50 mTorr.

44. The apparatus of claim 1 wherein gaseous species are present in the reaction compartment at a pressure and further comprising means for maintaining the pressure at a value less than 50 mTorr.

45. An apparatus for processing a substrate, the apparatus comprising:
   a. a reaction compartment;
   b. first and second electrodes, opposing one another across an active region within the reaction compartment, the first electrode having at least one dome therein, the at least one dome comprising a cylindrical hole in the first electrode and a hemispherical cap topping the hole, the at least one dome having an interior surface and forming a cavity having an opening toward the active region, the at least one dome supporting an electric field distribution in the cavity, the electric field distribution having comparable components in three dimensions;
   c. means for conveying gaseous species into the active region; and
   d. a source of electrical excitation, coupled to one of the first and second electrodes, for generating a processing medium in the active region, a medium of enhanced density forming in the cavity, the presence of the at least one dome thus causing an increased reaction rate over an area of the substrate in the active region directly under the at least one dome.

46. The apparatus of claim 45 wherein the hemispherical cap comprises an aperture therethrough.

47. A method of processing a substrate, the method comprising the steps of:
   a. placing the substrate in an active region of a reaction compartment, the active region being formed between a first electrode and a second electrode in opposition, near the second electrode, the first electrode having at least one dome therein, the at least one dome comprising a cylindrical hole in the first electrode and a hemispherical cap topping the hole, the at least one dome having an interior surface, forming a cavity having an opening toward the active region, and supporting an electric field distribution in the cavity, the electric field distribution having comparable components in three dimensions;

b. providing gaseous reactants to the active region; and c. providing electrical excitation to at least one of the first and second electrodes so as to generate a substrate-processing medium in the active region, a medium of enhanced density forming in the cavity, the presence of the at least one dome thus causing an increased reaction rate over an area of the substrate in the active region directly under the at least one dome.

48. The method of claim 47 wherein the hemispherical cap comprises an aperture therethrough.

* * * * *